(12) United States Patent
Lee

(10) Patent No.: US 7,208,346 B2
(45) Date of Patent: Apr. 24, 2007

(54) METHODS OF FORMING INTERPOSERS ON SURFACES OF DIES OF A WAFER

(76) Inventor: David Lee, 2497 Technology Dr., Hayward, CA (US) 94545

( * ) Notice: Subject to any disclaimer, the term of this patent is extended or adjusted under 35 U.S.C. 154(b) by 213 days.

(21) Appl. No.: 10/867,446

(22) Filed: Jun. 14, 2004

(65) Prior Publication Data
US 2005/0277228 A1   Dec. 15, 2005

(51) Int. Cl.
*H01L 21/44* (2006.01)
*H01L 21/48* (2006.01)

(52) U.S. Cl. .................... 438/110; 438/113; 438/458
(58) Field of Classification Search ........... 438/110, 438/113–114, 68, 33, 458, 462; 427/468, 427/272, 282
See application file for complete search history.

(56) References Cited

U.S. PATENT DOCUMENTS

| | | | |
|---|---|---|---|
| 5,468,681 A | 11/1995 | Pasch | |
| 5,644,167 A | 7/1997 | Weiler et al. | |
| 5,821,624 A | 10/1998 | Pasch | |
| 6,022,761 A | 2/2000 | Grupen-Shemansky et al. | |
| 6,054,337 A | 4/2000 | Solberg | |
| 6,197,613 B1 | 3/2001 | Kung et al. | |
| 6,376,769 B1 | 4/2002 | Chung | |
| 6,413,798 B2 | 7/2002 | Asada | |
| 6,743,699 B1* | 6/2004 | Doan | 438/460 |
| 6,933,172 B2* | 8/2005 | Tomimatsu | 438/109 |
| 2002/0162215 A1* | 11/2002 | Kledzik | 29/650 |
| 2003/0027373 A1 | 2/2003 | Distefano et al. | |

* cited by examiner

Primary Examiner—Thanhha S. Pham
(74) Attorney, Agent, or Firm—C. Bart Sullivan

(57) ABSTRACT

A method and apparatus to stencil interposers on a wafer of dies is described. In one embodiment, an interposer stenciling apparatus includes an interposer forming stencil configured to deposit interposer material onto a backside of a wafer of dies in a predetermined formation. In another embodiment, another interposer forming stencil is configured to form additional interposer layers on existing interposers to support dies thereon having different size configurations.

20 Claims, 6 Drawing Sheets

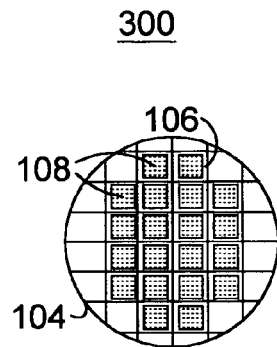
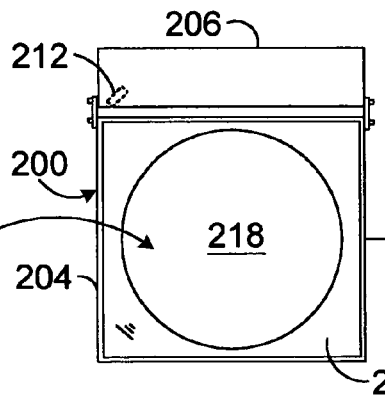
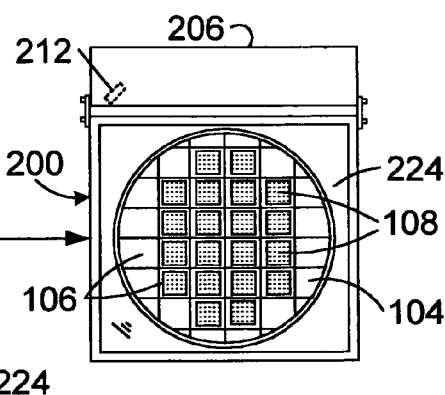
FIG. 3A   FIG. 3B   FIG. 3C
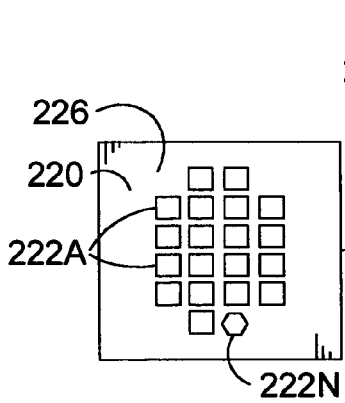
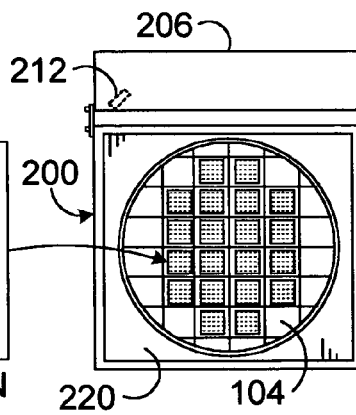
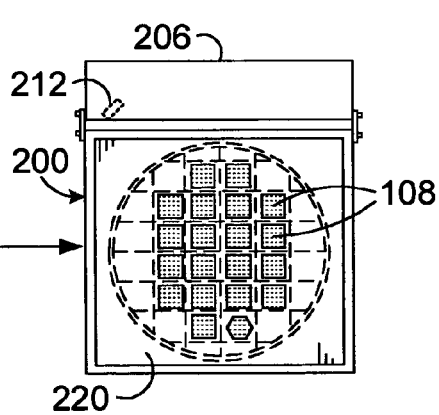
FIG. 3D   FIG. 3E   FIG. 3F
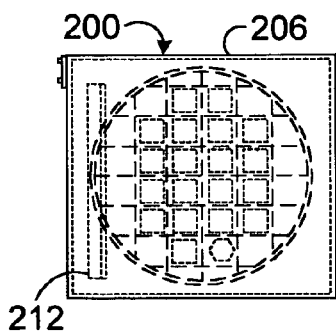
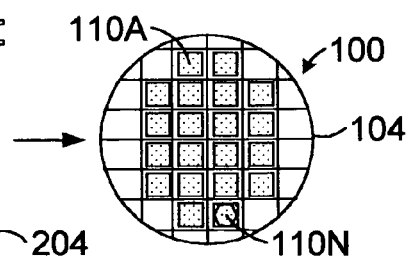
FIG. 3G   FIG. 3H

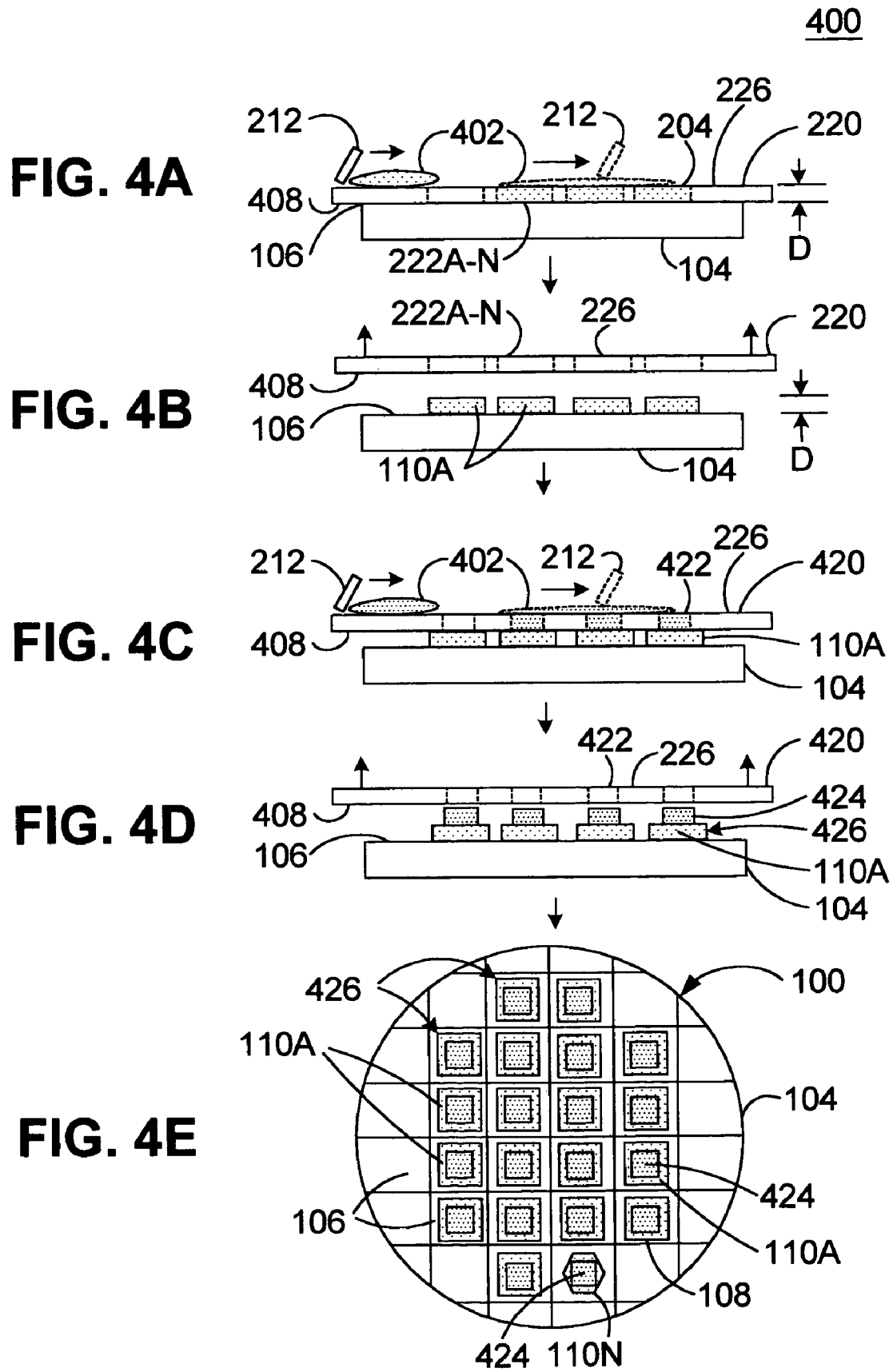

METHODS OF FORMING INTERPOSERS ON SURFACES OF DIES OF A WAFER

BACKGROUND OF THE INVENTION

1. Field of the Invention

The present invention relates generally to semiconductor manufacture and more particularly a system for fabricating interposers on semiconductor components.

2. Description of the Related Art

Generally, microelectronic devices include one or more die (i.e., micro integrated circuits formed on a single substrate) having a multitude of die bond pads, a chip body, and an interconnection scheme to connect the pads on the die to a supporting substrate. Generally, the supporting substrate is formed into a package around the die to provide physical protection from contaminates. The combination of these is generally referred to as a "chip package". Conventional packaging includes packages such as a dual-inline package (DIP), single-inline package (SIP), ball grid array (BGA), and others. Conventionally, dies are formed on substrates, e.g., wafers, in a batch process. A wafer generally contains many dies that are eventually singulated to produce individual dies that are then packaged on the supporting substrates as integrated circuits, which are then mounted on external circuit elements such as printed circuit boards. The printed circuit boards physically support integrated circuits and electrically interconnect the integrated circuits to, for example, other integrated circuits and circuit elements.

The size of integrated circuits is a major concern because the size of each integrated circuit may influence the size of the overall electronic device. Moreover, the size of the integrated circuit influences the distance required between each of the integrated circuits within the device as well as the distance between each integrated circuit and other elements of the integrated circuit. Changes in transmission impedances are directly affected by such distances thereby affecting signal propagation and therefore operating speed of such electronic devices.

Conventionally, to decrease distances between integrated circuits, manufacturers have worked to reduce integrated circuit package size. One such technique involves stacking dies on top of one another. To stack dies often one die is mounted to a supporting substrate using flip-chip mounting techniques. Generally, an interposer is then glued to the backside of the mounted die, e.g., lower supporting die. The interposer is used to mount another upper die thereto, e.g., upper die to form a stack of dies. Such an interposer acts as a mechanical and electrical separation between the upper and lower dies.

Generally, once the upper die is mounted to a top side of the interposer, a wire bonding machine or other wire bonding device is used to form electrical connections between the upper die, lower supporting die, and the supporting substrates. In some cases, a larger die in area is stacked above a lower die such that room is left on the lower die for wire bonding. In such stacking arrangements, a specialized interposer must be used to provide a base for the larger upper die with backing support for the larger upper die, as dies without backing support may be easily cracked during a wire bonding process. Interposers are generally preformed to accommodate different stacking configurations and must be glued or mounted to a supporting die or the upper die for mounting to the lower supporting die.

Such a process of mounting interposers between the upper die and lower die increases manufacturing time and expense. Further, as different interposers may be needed for different die-stack configurations, an interposer having an incorrect thickness and/or material makeup may cause failure of such stacked die. Moreover, storing of interposers having a variety of thicknesses and materials ads to the cost of integrated circuit manufacturing using such stored interposers.

Therefore, what is needed is an apparatus and method to provide interposers on individual electronic circuits in high volume that is efficient, flexible, and economical.

SUMMARY OF THE INVENTION

An embodiment of the present invention provides an apparatus configured to stencil one or more layers of interposer forming material on a surface of a wafer of dies to form one or more interposers thereon. The apparatus includes a frame configured to support the wafer in a processing position, to stencil the one or more interposers on the surface of the wafer, and an interposer forming stencil including at least one interposer forming aperture therein. The interposer forming stencil is configured to be positioned between the frame and the wafer such that the at least one interposer forming aperture is disposed above a surface of a respective one of the dies. The apparatus includes a stenciling apparatus disposed proximate an upper surface of the interposer forming stencil. The stenciling apparatus is configured to deposit the interposer material into the at least one interposer forming aperture and onto the surface of the respective one of the dies to form the one or more interposers thereon.

An embodiment of the present invention provides a method of forming at least one interposer on a surface of one or more dies of a wafer of one or more dies. The method includes positioning at least one interposer forming stencil about parallel to and adjacent the wafer wherein the at least one interposer forming stencil having at least one interposer forming aperture disposed therein. The method further includes positioning the at least one interposer forming aperture above a respective die surface disposed adjacent thereto and urging, with an interposer stenciling apparatus, an interposer material into and through the at least one interposer forming aperture. The method includes depositing the interposer material on the respective die surface positioned adjacent the at least one interposer forming aperture and shaping the interposer material with the at least one interposer forming aperture.

An embodiment of the present invention provides a method for forming at least one interposer on one or more dies that are part of a wafer. The method includes mounting the wafer to an interposer stenciling apparatus and positioning an interposer forming stencil above the wafer in position to form the at least one interposer on a backside surface portion of the one or more dies of the wafer being processed. The interposer forming stencil includes at least one interposer forming aperture disposed therein. The method further includes stenciling the at least one interposer on the one or more dies by moving a squeegee blade proximate to and across a surface of the interposer forming stencil having interposer material thereon, to deposit at least some of the interposer material into the at least one interposer forming aperture and onto the backside surface portion of the one or more dies being processed. The method further includes removing the interposer forming stencil to leave on the die being processed the at least one interposer material in a shape about that of the at least one interposer forming aperture, curing the deposited interposer material, and singulating the wafer into a plurality of the dies at least one of which having the at least one interposer thereon.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the present invention may admit to other equally effective embodiments.

FIGS. 3A through 3H illustrate a high-level operational view of one embodiment of a process for forming interposers on a substrate in accordance with embodiments of the invention.

FIGS. 4A through 4E illustrate a high-level operational view of one embodiment of a process for forming interposers on a substrate in accordance with embodiments of the invention.

DETAILED DESCRIPTION OF THE PREFERRED EMBODIMENT

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

Figure 1:
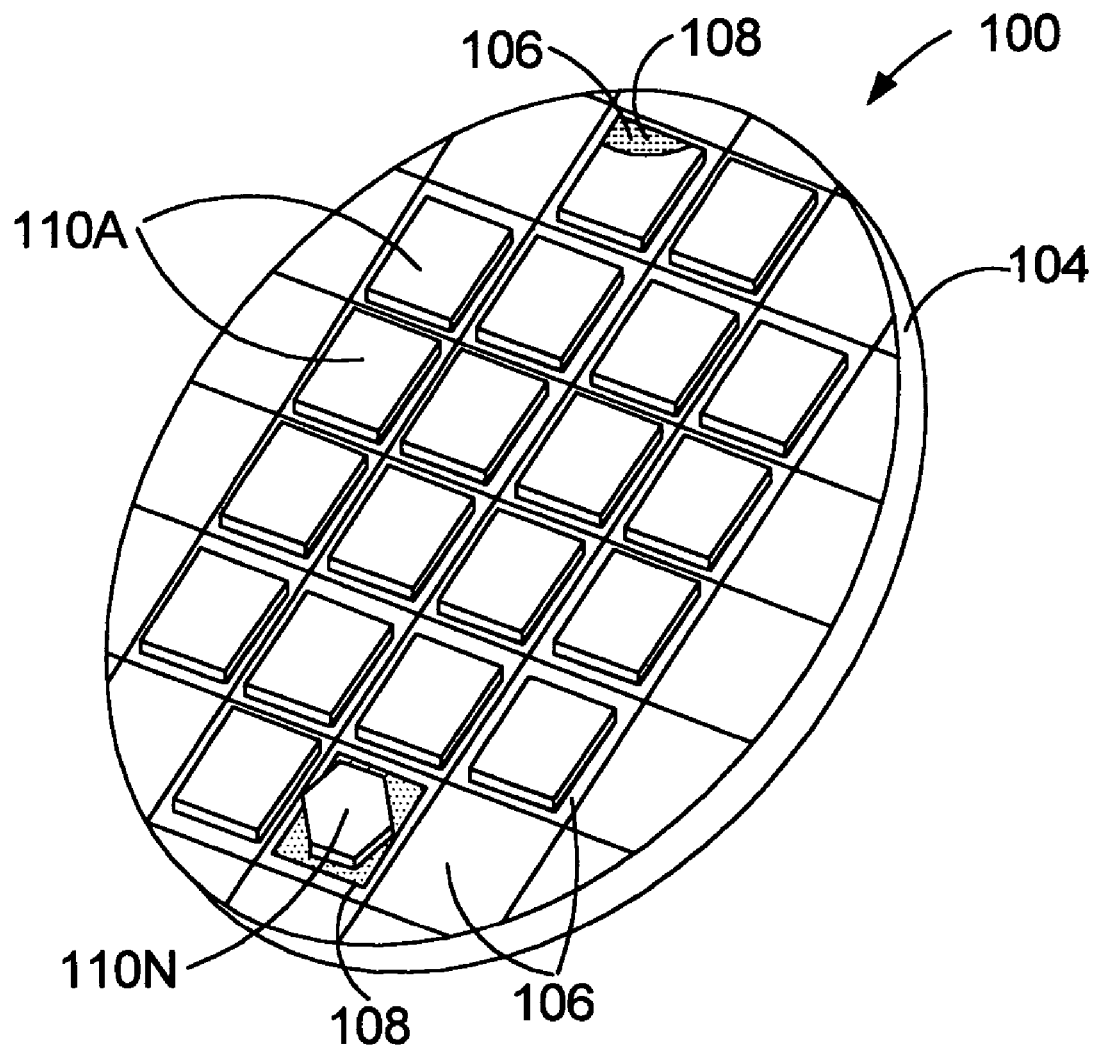
FIG. 1 is a perspective view of one embodiment of a substrate having a plurality of interposers formed thereon in accordance with embodiments of the invention.

FIG. 1 is a perspective view of one embodiment of a processed substrate 100 having a plurality of interposers 110A–N formed thereon in accordance with embodiments of the invention. N is defined herein as meaning an "Nth" number, e.g., one or more. FIG. 1 illustrates processed substrate 100 including a substrate 104, e.g., wafer. Substrate 104 includes a plurality of integrated circuits 108, e.g., dies 108, disposed thereon. To prepare dies 108 for a die stacking procedure, interposers 110A–N are formed thereon a backside surface 106 of one or more dies 108. Interposers 110A–N may be formed with one or more shapes configured to facilitate a die stacking operation. For example, one or more interposers 110A may be generally rectangular in shape whereas one or more interposers 110N may be of a different shape, e.g., round, square, hexagonal, and the like. While interposers 110A–N are described for clarity as shaped generally as a polygon or round configuration, virtually any shape may be used to advantage. For example, interposer 110A–N may be formed in a freeform shape configured to provide access to portions of a respective die 108 attached thereto that may be covered using a non-freeform shape, such as a rectangular shape.

Figure 2A:
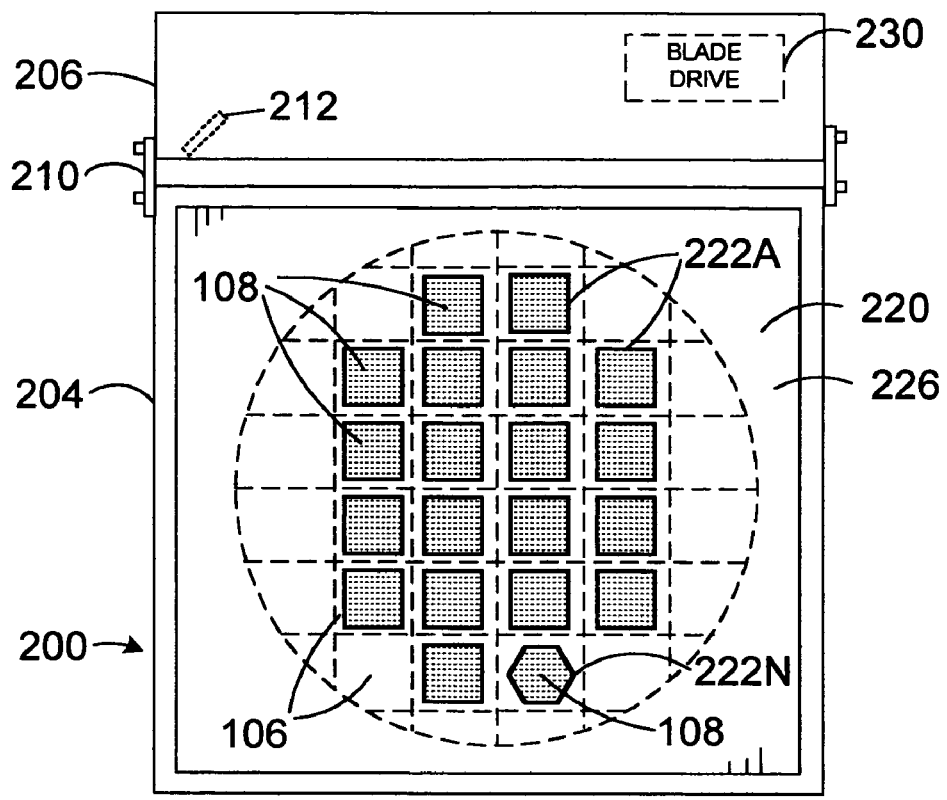
FIG. 2A is a high-level top view of one embodiment of an interposer stencil apparatus in accordance with embodiments of the invention.
Figure 2B:
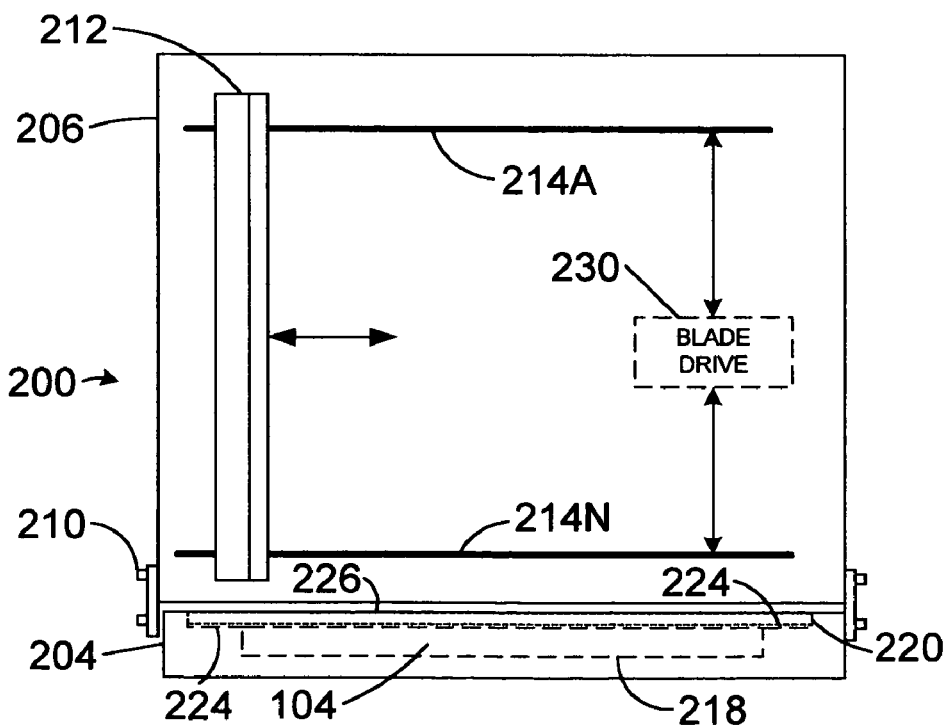
FIG. 2B is a high-level front view of one embodiment of an interposer stencil apparatus in accordance with embodiments of the invention.
Figure 2C:
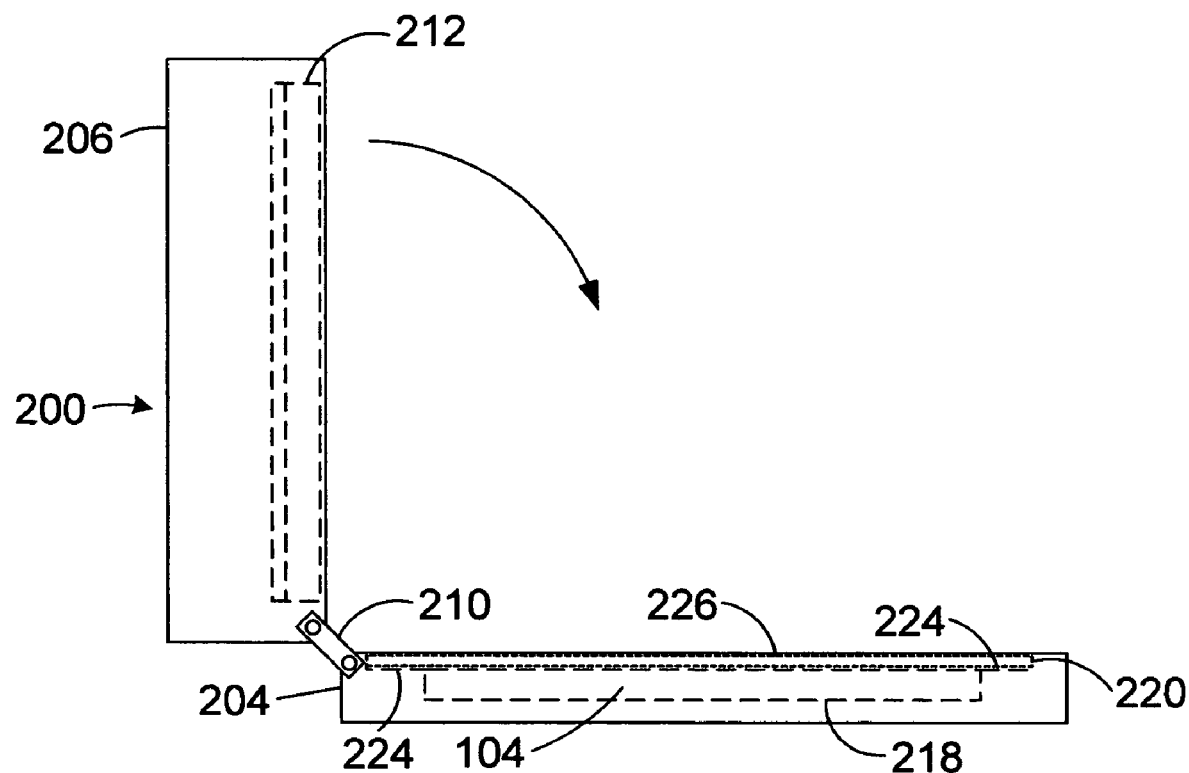
FIG. 2C is a high-level side view of one embodiment of an interposer stencil apparatus in accordance with embodiments of the invention.

FIG. 2A is a high-level top view, FIG. 2B is a high-level front view, and FIG. 2C is a high-level side view of one embodiment of an interposer forming apparatus 200 in accordance with embodiments of the invention. Interposer forming apparatus 200 includes a base 204 and a stenciling apparatus 206 hingedly attached together via one or more hinges 210. Base 204 and stenciling apparatus 206 cooperate in a clamshell fashion such that when closed, substrate 104 (See FIG. 1) is held therebetween for forming interposers 110A–N thereon.

Base 204 includes a substrate receiving recess 218. Recess 218 is configured to support a substrate 104 therein in a processing position. For example, recess 218 may be sized to accommodate substrate 104 therein while providing sufficient room to remove such substrate 104 after processing. Base 204 may be formed of rigid and semi-rigid materials such as steel and plastic that may be used to advantage. During an interposer formation process, an interposer forming stencil 220 is disposed upon a shelf 224 of recess 218. Shelf 224 may be configured to have sufficient depth relative to a top of base 204 to allow interposer forming stencil 220 to be received within recess 218 and be held above substrate 104 during substrate processing, for example. Interposer forming stencil 220 may be configured from a variety of rigid and semi-rigid materials that may be used to advantage. For example, interposer forming stencil 220 may be formed of metals such as steel, stainless steel, aluminum, copper, brass, and other metallic alloys that may be used to advantage. Interposer forming stencil 220 may also be formed of polymers such as plastic material configured to support processing substrate 104. Interposer forming stencil 220 may also be formed of ceramics such as fired clay material configured to support processing substrate 104.

Interposer forming stencil 220 may be configured to be disposed within recess 218 on shelf 224 and be removable therefrom. Interposer forming stencil 220 includes one or more interposer forming apertures 222A through 222N. Apertures 222A through 222N are configured to provide, during an interposer formation process, a shape to interposers 110A–N. Interposer forming apertures 222A–N may be configured in a plurality of similar and different shapes that may be used to advantage. For example, for a substrate 104 with a similar die 108 having a similar interposer configuration requirement, interposer forming stencil 220 may include one or more interposer forming apertures 222A–N that are about similar in geometry. However, interposer forming stencil 220 may include interposer forming apertures 222A–N with one or more varieties and geometric variations configured to accommodate different interposer 110A–N requirements. For example, as illustrated in FIG. 2A, interposer forming stencil 220 may include one or more interposer forming apertures 222 that are generally rectangular in shape and one or more interposer forming apertures 222N that are shaped differently, e.g., hexagonal, than rectangular interposer forming apertures 222.

Stenciling apparatus 206 includes a blade 212, e.g., stenciling blade, and a blade drive 230. Blade 212 is configured to squeegee, e.g., slidably force, an interposer base material, e.g., filler material, embodiments of which described below, into interposer forming apertures 222A–N, e.g., openings in interposer forming stencil 220, to form interposers 110A–N therefrom during processing on one or more dies 108 as described herein. Blade 212 is coupled to blade drive 230 through one or more slots 214A–N. In operation, blade drive 230 moves blade 212 across an upper surface 226 of interposer forming stencil 220 as described below. While stenciling apparatus 206 is described for clarity in terms of a blade type squeegee system, other interposer base material depositing systems are contemplated. For example, stenciling apparatus 206 may include a roller system designed to roll such interposer base material into interposer forming apertures 222A–N. Stenciling apparatus 206 may also include a robotic filler injection system where each interposer forming aperture 222A–N is filled with interposer base material by such a robotic filler injection system (not shown). Such a robotic filler injection system may be configured to pour semi-liquid interposer base material into each interposer forming apertures 222A–N.

FIGS. 3A through 3H illustrate a high-level operational view of one embodiment of a process 300 for forming one or more interposers 110A–N on a substrate 104 in accordance with embodiments of the invention. FIG. 3A illustrates substrate 104, e.g., wafer, having one or more dies 108. FIG. 3B illustrates an interposer forming apparatus 200 with a stenciling apparatus 206 in an open position ready to receive substrate 104 within a recess 218. FIG. 3C illustrates substrate 104 positioned in recess 218. FIG. 3D illustrates one example of an interposer forming stencil 220 having one or more interposer forming apertures 222A–N disposed therein. FIG. 3E illustrates substrate 104 positioned to receive interposer forming stencil 220 thereon. In one configuration, one or more interposer forming apertures 222A–N are positioned proximate respective dies 108 to form interposers 110A–N thereon. FIG. 3F illustrates interposer forming stencil 220 disposed proximate substrate 104 in a processing position. Interposer forming apparatus 200 is closed as illustrated in FIG. 3G in a clamshell arrangement such that stenciling apparatus 206 is positioned above substrate 104 and interposer forming stencil 220. In such a processing configuration, interposer forming stencil 220 is aligned such that a blade 212 may be moved across an upper surface 226 (described herein) of interposer forming stencil 220 by a blade drive 230 (described herein) to squeegee, e.g., force, inject, etc., interposer formation material therein described below into interposer forming apertures 222A–N. Such interposer formation material is forced through interposer forming apertures 222A–N to form interposers 110A–N on a surface portion of one or more dies 108, such as a backside surface 106. Upon completion of interposer formation, a processed substrate 100 which includes one or more interposers 110A–N thereon is removed from interposer forming apparatus 200 as illustrated in FIG. 3H.

FIGS. 4A through 4E illustrate a high-level operational view of one embodiment of a process 400 for forming one or more interposers 110A–N on a substrate 104 in accordance with embodiments of the invention. FIG. 4A illustrates substrate 104 having an interposer forming stencil 220 disposed about parallel to and positioned above substrate 104. For example, substrate 104 may be processed in an interposer forming apparatus 200 as described above (See FIG. 2). Illustrated in FIG. 4A, an interposer forming material 402 is disposed on a top surface 226 of interposer forming stencil 220 having a bottom surface 408 disposed about parallel to and proximate a backside surface 106 of substrate 104. Interposer forming material 402 includes one or more polymer materials configured to form at least one interposer 110A–N. For clarity, interposer 110A is illustrated with respect to FIGS. 4A–4D. However, virtually any number of interposers 110A–N (See FIG. 1) may be formed with different shapes as illustrated in FIG. 4E, some of which are described herein. In one operation, a blade 212 is moved across upper surface 226 to squeegee, e.g., urge, interposer forming material 402 into one or more interposer forming apertures 222A–N. Such interposer forming material 402 is forced through interposer forming apertures 222A–N to form one or more interposers 110A–N on backside surface 106 of one or more dies 108 (See FIG. 1). To create an interposer 110A–N having a predetermined thickness, interposer forming stencil 220 may be configured with a predetermined thickness D. For example, a thinner interposer 110A–N may be formed using a thinner interposer forming stencil 220 having a thinner thickness D, whereas a thicker interposer 110A–N may be formed using an interposer forming stencil 220 having a greater thickness D. FIG. 4B illustrates Interposer forming stencil 220 being removed from substrate 104 thereby leaving interposers 110A–N disposed thereon. During such an interposer forming process 400, interposer forming material 402 may be cured using a curing process configured to cure the interposer forming material 402 over a predetermined temperature and time to provide a cured interposer 110A–N.

In one operational configuration, one or more interposers 110A–N may be formed from layers of interposer material 402. For example, as illustrated in FIG. 4C though FIG. 4E, to form one or more interposers 110A–N configured to support a die 108 with a different geometry than a respective die 108 having a respective interposer 110A–N formed thereon, a processed substrate 100 may be reprocessed to add another interposer structure 424 on top of interposer 110A–N. Such interposer structure 424 may be configured larger or smaller in horizontal and vertical geometry than interposer 110A–N to support another die 108 thereon, and increase a standoff height from die 108. Similar as described above, to add such other interposer structure 424, another interposer forming stencil 420 having a similar or different configurations of one or more interposer forming apertures 422 is disposed above processed substrate 100. Interposer forming apertures 422 are aligned with one or more respective formed interposers 110A–N. Subsequently, blade 212 is moved to squeegee another interposer forming material 402 into interposer forming apertures 422 to deposit interposer structure 424 on top of one or more interposers 110A–N thereby forming one or more interposers 426, e.g., a composite of interposer 110A–N and interposer structure 424. FIG. 4E illustrates a processed substrate 100 having one or more interposers 426 thereon. While for clarity, only an additional interposer structure 424 is illustrated in combination with interposers 110A–N to form one or more interposers 426, it is contemplated that virtually any number of interposer layer structures may be used to form one or more interposers 426.

Figure 5:
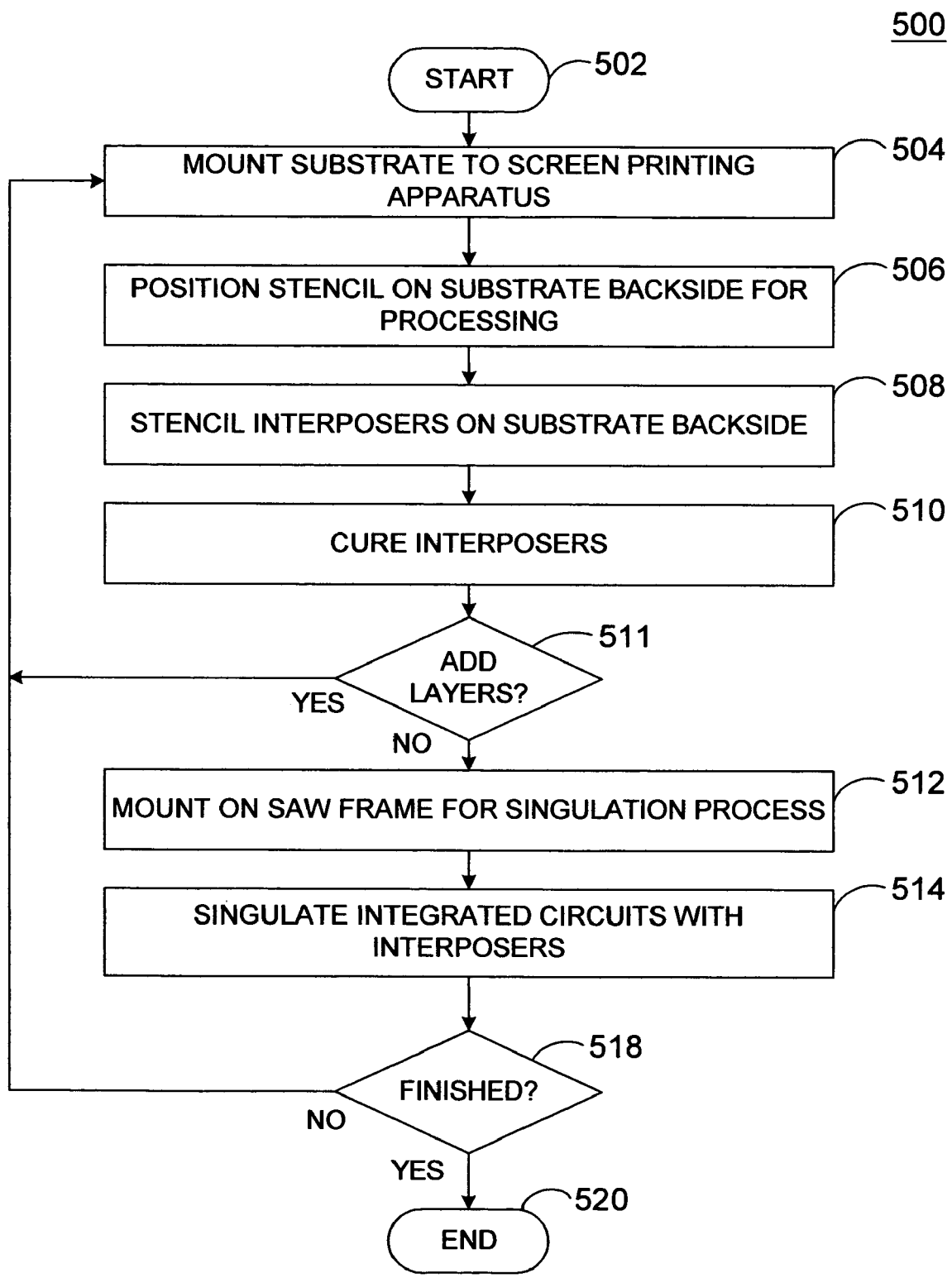
FIG. 5 is a high-level flow diagram of one embodiment of a method of forming interposers on semiconductor devices such as dies in accordance with embodiments of the invention.

FIG. 5 is a high-level flow diagram of one embodiment of a method 500 of forming one or more interposers 110A–N, 426 on semiconductor devices such as a plurality of dies 108 in accordance with embodiments of the invention. Method 500 may be started at 502 for example by initiating a processing sequence of an interposer forming apparatus 200. At 504, similar to FIG. 3C, a substrate 104 is disposed within interposer forming apparatus 200 for processing thereof. At 506, an interposer forming stencil 220 is positioned above substrate 104. At 508, an interposer forming material 402 such as described herein is disposed on an upper surface 226 of interposer forming stencil 220. Such interposer forming material 402 is then urged into one or more interposer forming apertures 222A–N. Such interposer forming material 402 is cured at 510. Curing the interposer forming material 402 may involve a curing processes as known in the art configured to cure interposer forming material 402. For example, a curing process may be configured to heat and cool interposer forming material 402 within a predetermined temperature range, temperature gradient, and time.

In one embodiment, at 511 one or more additional interposers layers may be added to accommodate dies 108 having different geometries. For example, as described with respect to FIGS. 4A through 4E, one or more first interposers 110 may be formed and cured as described above. At 511, an additional interposer layer such as an interposer structure 424 may be added by reprocessing a processed substrate 100 with an interposer forming stencil 420 having one or more interposer forming apertures 422 configured for such additional interposer layers to form, for example, one or more interposers 426. If at 511, additional layers are to be processed, e.g., added, method 500 returns to 504. If at 511 additional interposer layers are not to be processed, method 500 proceeds to 512.

At 512, processed substrate 100 having interposers 110A–N, 426 disposed thereon a backside surface 106 of one or more dies 108 is separated from interposer forming stencil 220. Such substrate 104 is mounted to a wafer singulation apparatus as known, e.g., saw, laser cutting device, etc., which is configured to divide such processed substrate 100 into one or more individual dies 108. At 514, such processed substrate 100 is then singulated into plurality of dies 108 having an interposer 110A–N, 426 disposed thereon. If at 518 method 500 is finished, then method 500 ends at 520. If however, method 500 is not finished, method 500 returns to 504.

While the foregoing is directed to embodiments of the present invention, other and further embodiments of the invention may be devised without departing from the basic scope thereof, and the scope thereof is determined by the claims that follow.

The invention claimed is:

1. A method of forming at least one interposer on a surface of one or more dies of a wafer, the method comprising:
    positioning a first interposer forming stencil about parallel to and adjacent the wafer, the first interposer forming stencil having at least one first interposer forming aperture disposed therein;
    positioning the at least one first interposer forming aperture above a respective die surface disposed adjacent thereto;
    urging, with an interposer stenciling apparatus, an interposer material into and through the at least one first interposer forming aperture to deposit the interposer material on the respective die surface positioned adjacent the at least one first interposer forming aperture;
    shaping the interposer material with the at least one first interposer forming aperture to form a first interposer structure on the die surface; and
    after forming the first interposer structure, using a second interposer forming stencil having at least one second interposer forming aperture disposed therein to stencil a second interposer structure directly on and in physical contact with the first interposer structure, wherein the second interposer structure comprises a different geometry than the first interposer structure, wherein the first interposer structure and the second interposer structure form a third interposer structure.

2. The method of claim 1, further comprising after forming the third interposer structure, using a third interposer forming stencil having at least one third interposer forming aperture disposed therein to stencil a fourth interposer structure directly on and in physical contact with the second interposer structure, wherein the fourth interposer structure comprises a different geometry than the second interposer structure, wherein the third interposer structure and the fourth interposer structure form a fifth interposer structure.

3. The method of claim 1, wherein positioning the first interposer forming stencil comprises positioning the wafer in a frame portion of the interposer stenciling apparatus and then positioning the first interposer forming stencil above the wafer using the frame portion to align the at least one first interposer forming aperture with the respective die surface disposed adjacent thereto.

4. The method of claim 1, wherein the urging, comprises sliding a blade across a face of the first interposer forming stencil having the interposer material disposed thereon to force the interposer material into and through the at least one first interposer forming aperture.

5. The method of claim 1, further comprising curing the first interposer structure by heating the first interposer structure within a predetermined temperature range for a predetermined amount of time.

6. The method of claim 1, wherein the first interposer forming stencil comprises a thickness dimension configured to provide the first interposer structure with a predetermined thickness.

7. A method for forming at least one interposer on one or more dies of a wafer, the method comprising:
    positioning the wafer adjacent to an interposer stenciling apparatus including a first interposer forming stencil;
    positioning the first interposer forming stencil above the wafer in a position to form at least one first interposer on a backside surface portion of the one or more dies of the wafer being processed, the first interposer forming stencil including at least one first interposer forming aperture disposed therein;
    stenciling the at least one first interposer on the backside surface portion of the one or more dies of the wafer by moving a stenciling blade proximate to and across a surface of the first interposer forming stencil having an interposer material disposed thereon to urge; the interposer material into and through the at least one first interposer forming aperture and onto the backside surface portion of the one or more dies being processed;
    removing the first interposer forming stencil to leave on the backside surface portion of the one or more dies being processed the interposer material in a shape about that of the at least one first interposer forming aperture;
    curing the at least one first interposer;
    after curing the at least one first interposer, positioning a second interposer forming stencil adjacent the at least one first interposer, wherein the second interposer forming stencil comprises at least one second interposer forming aperture disposed therein;
    urging interposer material into and through the at least one second interposer forming aperture to deposit a second interposer directly on a surface of the first interposer to form at least one third interposer, wherein the at least one second interposer comprises a different geometry than the at least one first interposer;
    curing the at least one third interposer; and
    singulating the wafer into the one or more dies at least one of which having the at least one third interposer thereon.

8. The method of claim 7, wherein mounting the wafer comprises positioning the wafer such that a backside surface of the wafer is positioned adjacent to and about parallel to a lower surface of the first interposer forming stencil.

9. The method of claim 7, further comprising positioning a third interposer forming stencil above the wafer in position to form at least one fourth interposer directly on and in physical contact with the at least one third interposer, the third interposer forming stencil including at least one third interposer forming aperture disposed therein.

10. The method of claim 7, wherein the first interposer forming stencil comprises one or more third interposer forming apertures, wherein the one or more third interposer apertures have a different shape than a shape of the at least one first interposer aperture or a shape of the at least one second interposer aperture.

11. The method of claim 7, wherein stenciling comprises depositing the interposer material onto an upper surface of the first interposer forming stencil then moving the stenciling blade to force at least some of the interposer material into and through the at least one first interposer forming aperture.

12. The method of claim 7, further comprising, after curing the at least one third interposer, stenciling a forth interposer onto a surface of the at least one third interposer using a third interposer forming stencil having at least one third interposer forming aperture disposed therein, wherein the at least one third interposer and the at least one fourth interposer form at least one fifth interposer.

13. The method of claim 12, wherein the at least one second interposer comprises a surface area sized to accommodate a second die thereon, wherein the second die has a different size relative to a size of at least one die of the one or more dies of the wafer.

14. A method of forming at least one first interposer on a surface of one or more dies, the method comprising:
    positioning a first interposer forming stencil above a respective die surface disposed adjacent thereto;
    urging interposer material through at least one first interposer forming aperture disposed in the first interposer forming stencil to shape the interposer material in accordance with a shape of the at least one first interposer forming aperture to stencil a first layer of the interposer material onto the respective die surface;
    positioning above the first layer a second interposer forming stencil having at least one second interposer forming aperture disposed therein:
    forcing the interposer material into and through the at least one second interposer forming aperture to stencil another layer of the interposer material directly onto and in contact with the first layer to form a second layer of the at least one first interposer, wherein the second layer comprises a geometry that is different from a geometry of the first layer, wherein adding the second layer changes a shape of the at least one first interposer from a first shape corresponding to a shape of the first layer, to a second shape corresponding to the combination of the first layer and second layer.

15. The method of claim 14, wherein the first interposer forming stencil or the second interposer forming stencil comprises at least one third interposer forming aperture having a shape that is different from a shape of the at least one first interposer forming aperture or a shape of the at least one second interposer forming aperture.

16. The method of claim 14, wherein urging comprises urging a squeegee against the interposer material to force the interposer material through the at least one first interposer forming aperture.

17. The method of claim 14, further comprising positioning a third interposer forming stencil having at least one third interposer forming aperture disposed therein, and forcing the interposer material into and through the at least one third interposer forming aperture to stencil an additional layer of the interposer material directly onto and in physical contact with the second layer to form a third layer of the at least one first interposer.

18. The method of claim 14, further comprising curing the first layer before stenciling the second layer.

19. The method of claim 14, wherein the first layer and second layer have different thicknesses.

20. The method of claim 14, further comprising curing the second layer.

* * * * *